United States Patent
Park et al.

(10) Patent No.: US 9,897,789 B2
(45) Date of Patent: Feb. 20, 2018

(54) LIGHT EMITTING DEVICE PACKAGE AND LIGHTING DEVICE HAVING THE SAME

(71) Applicant: SAMSUNG ELECTRONICS CO., LTD., Suwon-si, Gyeonggi-do (KR)

(72) Inventors: Young Sam Park, Seoul (KR); Hyun Bae Park, Hwaseong-si (KR); Subedi Rabindra, Suwon-si (KR); Chul Soo Yoon, Suwon-si (KR); Giun Lim, Gwacheon-si (KR); Ji Hyun Lim, Seoul (KR); Young Sik Jeong, Seoul (KR); Hun Joo Hahm, Seongnam-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 262 days.

(21) Appl. No.: 14/805,444

(22) Filed: Jul. 21, 2015

(65) Prior Publication Data

US 2016/0109096 A1    Apr. 21, 2016

(30) Foreign Application Priority Data

Oct. 17, 2014 (KR) .................. 10-2014-0141058

(51) Int. Cl.
*F21V 7/04* (2006.01)
*G02B 19/00* (2006.01)
*G02B 5/00* (2006.01)
*H01L 33/58* (2010.01)
*H01L 33/60* (2010.01)
*F21V 29/76* (2015.01)
*F21V 29/77* (2015.01)

(Continued)

(52) U.S. Cl.
CPC .......... *G02B 19/0047* (2013.01); *G02B 5/001* (2013.01); *H01L 33/58* (2013.01); *H01L 33/60* (2013.01); *F21K 9/23* (2016.08); *F21V 29/763* (2015.01); *F21V 29/77* (2015.01); *F21Y 2103/10* (2016.08); *F21Y 2105/10* (2016.08); *F21Y 2115/10* (2016.08)

(58) Field of Classification Search
CPC .. G02B 6/0073; G02B 6/0055; G02B 6/0031; G02B 6/009; G02B 6/0021; G02B 6/003
USPC .......................................................... 362/612
See application file for complete search history.

(56) References Cited

U.S. PATENT DOCUMENTS

| 6,372,608 B1 | 4/2002 | Shimoda et al. |
| 6,645,830 B2 | 11/2003 | Shimoda et al. |

(Continued)

FOREIGN PATENT DOCUMENTS

| JP | 2008-294309 A | 12/2008 |
| KR | 10-2008-0084646 A | 9/2008 |

(Continued)

*Primary Examiner* — William Carter
(74) *Attorney, Agent, or Firm* — Muir Patent Law, PLLC

(57) ABSTRACT

A light emitting device package includes a reflective unit having a first surface and a second surface opposing the first surface and having a through hole formed in a central portion of the reflective unit to penetrate through the first and second surfaces, a light emitting device disposed in the through hole and externally exposed to one of the first and second surfaces, and an optical device disposed on the first surface of the reflective unit to cover the light emitting device. The optical device allows light generated by the light emitting device to be partially transmitted and partially reflected to be emitted externally.

19 Claims, 13 Drawing Sheets

(51) Int. Cl.
*F21Y 105/10* (2016.01)
*F21K 9/23* (2016.01)
*F21Y 103/10* (2016.01)
*F21Y 115/10* (2016.01)

(56) References Cited

U.S. PATENT DOCUMENTS

| | | | |
|---|---|---|---|
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,709,857 B2 | 5/2010 | Kim et al. | |
| 7,748,873 B2 * | 7/2010 | Kim | H01L 33/54 362/308 |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,869,674 B2 | 1/2011 | Kim et al. | |
| 7,909,486 B2 | 3/2011 | Kim | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 | 3/2012 | Kang et al. | |
| 8,179,938 B2 | 5/2012 | Kim | |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,735,931 B2 | 5/2014 | Han et al. | |
| 8,766,295 B2 | 7/2014 | Kim | |
| 2006/0273337 A1 * | 12/2006 | Han | H01L 33/54 257/98 |
| 2008/0303757 A1 * | 12/2008 | Ohkawa | F21V 5/04 362/235 |
| 2013/0309790 A1 | 11/2013 | Lin et al. | |
| 2015/0062966 A1 * | 3/2015 | Nam | H01L 33/20 362/612 |

FOREIGN PATENT DOCUMENTS

| | | |
|---|---|---|
| KR | 20-0450823 Y1 | 11/2010 |
| KR | 10-2012-0017703 A | 2/2012 |
| KR | 10-1212544 B1 | 12/2012 |
| KR | 10-2013-0053350 A | 5/2013 |
| KR | 10-1337502 B1 | 12/2013 |

* cited by examiner

LIGHT EMITTING DEVICE PACKAGE AND LIGHTING DEVICE HAVING THE SAME

CROSS-REFERENCE TO RELATED APPLICATION

This application claims priority to and benefit of Korean Patent Application No. 10-2014-0141058, filed on Oct. 17, 2014, with the Korean Intellectual Property Office, the disclosure of which is incorporated herein by reference.

BACKGROUND

The present disclosure relates to a light emitting device package and a lighting device having the same.

In backlight units, secondary lenses may be further installed, separately to light emitting device packages used as light sources, in order to implement a wide angle in a spread of light beams. Such secondary lenses, wide beam spread lenses, are used to diffuse light across a relatively wide region in a lateral direction from a central portion thereof, via refraction of light. Such secondary lenses are generally fixedly mounted on printed circuit boards on which light emitting device packages are mounted, separately from light emitting device packages.

However, such secondary lenses have negative attributes in that the sizes of the secondary lenses are relatively large and it may be difficult to precisely allow centers of a light emitting device package and a secondary lens to precisely coincide with each other during a separate lens mounting process. Further, since additional space for lens mounting is required, printed circuit boards (PCB) should be designed to have an unnecessarily wide area. Thus, production costs may be increased.

SUMMARY

Some embodiments in the present disclosure may provide a scheme in which the occurrence of problems caused by using secondary lenses according to the related art may be prevented.

According to exemplary embodiments in the present disclosure, a light emitting device package includes a reflective unit having a first surface and a second surface opposing the first surface and having a through hole formed in a central portion of the reflective unit to penetrate through the first and second surfaces, a light emitting device disposed in the through hole and externally exposed to one of the first and second surfaces, and an optical device disposed on the first surface of the reflective unit to cover the light emitting device. The optical device allows light generated by the light emitting device to be partially transmitted and be partially reflected to be emitted externally.

The optical device may have a third surface facing the first surface of the reflective unit, a fourth surface disposed above the third surface, and a fifth surface connecting the third surface to the fourth surface, and the fourth surface may allow a portion of light emitted by the light emitting device and incident through the third surface to be transmitted directly through an upper portion of the fourth surface and emitted externally while allowing a portion of the light to be reflected toward the fifth surface and externally emitted through the fifth surface.

The fourth surface may have a structure recessed from an edge of the fourth surface connected to the fifth surface to a center of the fourth surface through which an optical axis passes.

The light emitting device package may further include a reflective layer covering the fourth surface.

The reflective layer may have a structure of a metal layer or a stacking structure of a plurality of transparent layers having different refractive indices.

The plurality of transparent layers may be stacked on one another to have a structure in which the refractive indices of the plurality of transparent layers are gradually increased.

The fifth surface of the optical device and the lateral surface of the reflective unit may be tangent to each other.

The light emitting device package may further include a wavelength conversion layer covering the light emitting device.

The wavelength conversion layer may be provided as a surface coplanar with the first surface of the reflective unit.

The light emitting device may include at least one pair of electrode pads disposed on a surface of the light emitting device exposed to the second surface of the reflective unit.

The optical device may further include a recess portion provided in a surface of the optical device disposed on the first surface of the reflective unit.

The recess portion may be disposed in a structure to oppose the light emitting device.

According to exemplary embodiments in the present disclosure, a lighting device may include a housing having an electrical connection structure, and at least one light emitting device package mounted in the housing.

The lighting device may further include a cover mounted on the housing to cover the at least one light emitting device package.

The lighting device may further include an optical sheet disposed above the housing.

According to exemplary embodiments in the present disclosure, a light emitting device package may include a reflective unit having a first surface and a second surface opposing the first surface, and having a through hole formed in a central portion of the reflective unit and penetrating through the first and second surfaces, a light emitting device disposed in the through hole and exposed to the second surfaces, and an optical device disposed on the first surface of the reflective unit to cover the through hole. A thickness of the optical device may increase in a direction parallel to the first surface and away from the central portion of the reflective unit.

An outer circumferential shape of the optical device may be a circular shape and the direction may be a radial direction of the circular shape.

Electrode pads of the light emitting device and the second surface of the reflective unit may be coplanar with each other.

The light emitting device package of claim may further include a layer covering the optical device and having a structure of a metal layer or a stacking structure of a plurality of transparent layers having different refractive indices.

The optical device and the reflective unit may directly contact with each other.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
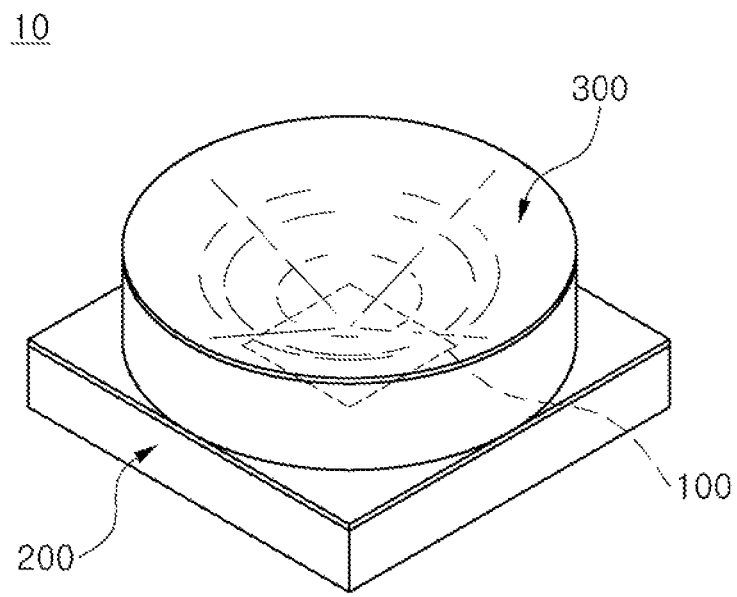
FIG. 1 is a schematic perspective view of a light emitting device package according to an exemplary embodiment in the present disclosure.

Embodiments of the present disclosure will now be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements. Unless explicitly described otherwise, the terms 'on', 'upper part', 'upper surface', 'lower part', 'lower surface', 'upward', 'downward', 'side surface', and the like will be used, based on the drawings, and may be changed depending on a direction in which a device or a constituent element is actually disposed.

Figure 2:
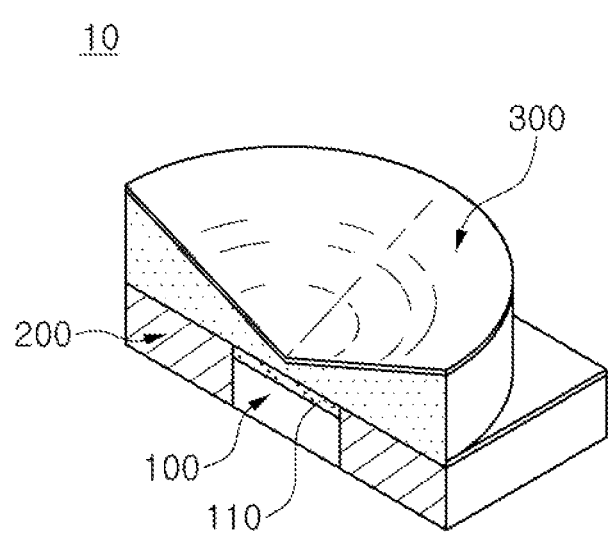
FIG. 2 is a cutaway perspective view of FIG. 1.

With reference to FIGS. 1 to 3, a light emitting device package according to an exemplary embodiment in the present disclosure will be described.

Figure 3A:
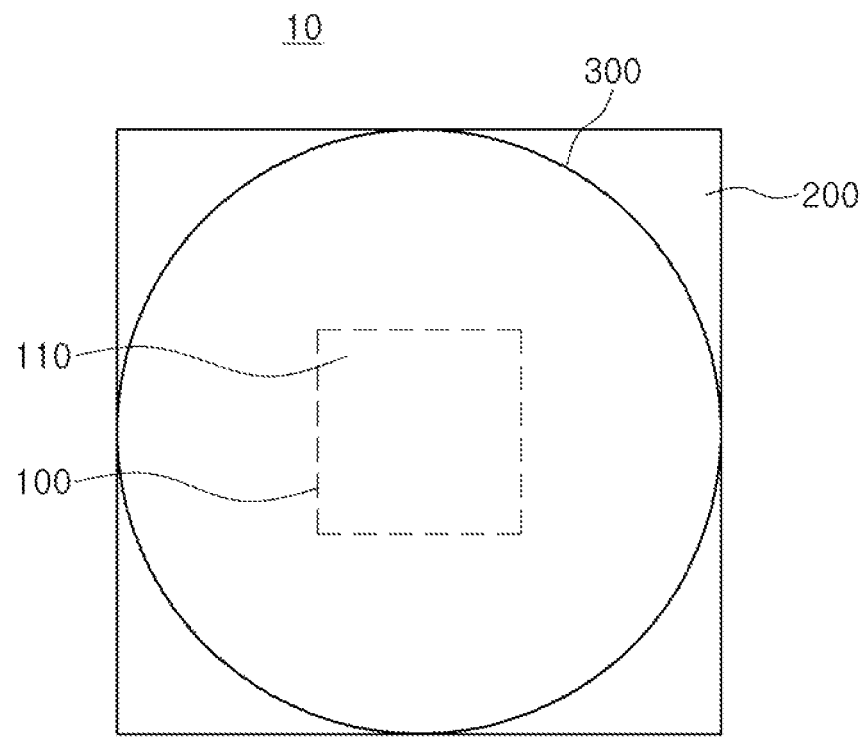
FIGS. 3A and 3B respectively illustrate a plan view and a cross sectional view of the light emitting device package of FIG. 1.
Figure 3B:
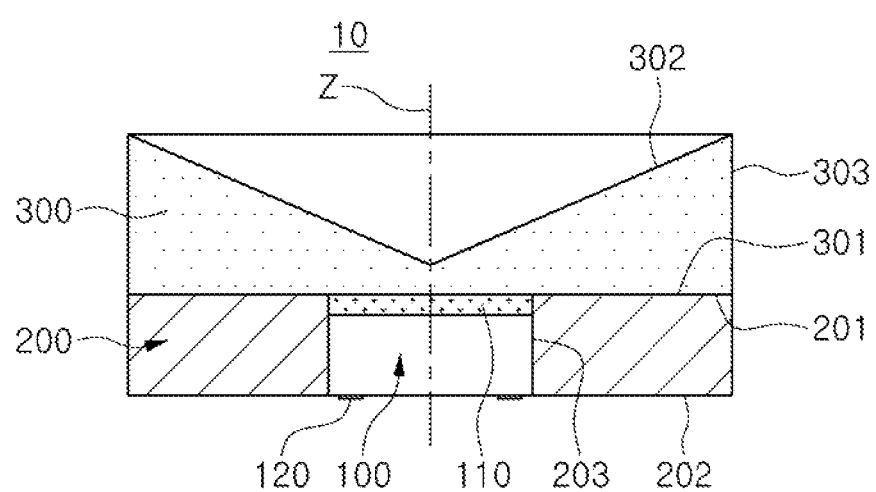

FIG. 1 is a schematic cutaway perspective view of alight emitting device package according to an exemplary embodiment in the present disclosure, FIG. 2 is a cutaway perspective view of FIG. 1, and FIGS. 3A and 3B respectively illustrate a plan view and a cross sectional view of the light emitting device package of FIG. 1.

With reference to FIGS. 1 to 3, a light emitting device package 10 according to an exemplary embodiment in the present disclosure may include alight emitting device 100, a reflective unit 200, and an optical device 300.

The light emitting device 100 may be provided as an electroluminescence device generating light having a predetermined wavelength by drive power applied externally. For example, the light emitting device 100 may include a semiconductor light emitting diode (LED) having an n-type semiconductor layer and a p-type semiconductor layer, and an active layer disposed therebetween.

As the light emitting device 100, semiconductor light emitting diode (LED) chips having various structures may be used. Configurations and structures of the light emitting device 100 will be described in detail below.

A wavelength conversion layer 110 may be provided on an upper surface of the light emitting device 100 to cover the light emitting device 100. At least one pair of electrode pads 120 may be provided on a lower surface of the light emitting device 100 to be electrically connected to an external power source.

The wavelength conversion layer 110 may contain a wavelength conversion material. As the wavelength conversion material, for example, a material containing at least one or more phosphors excited by light generated in the light emitting device 100 to thus emit light having a different wavelength may be used so that light having various colors as well as white light may be emitted through control thereof.

For example, when the light emitting device 100 emits blue light, white light may be emitted through a combination of yellow, green, red or orange phosphors therewith. In addition, the light emitting device package 10 may also be configured to include at least one of light emitting devices emitting violet, blue, green, red or infrared light. In this case, the light emitting device 100 may perform controlling so that a color rendering index (CRI) thereof may be controlled from a level of light produced by a sodium-vapor lamp or the like, having a CRI of 40, to a level of natural sunlight having a CRI of 100, and further, may emit various types of white light having a color temperature of around 2000K to around 20000K. In addition, color may be adjusted to be appropriate for an ambient atmosphere or for people's moods by generating visible violet, blue, green, red or orange light or infrared light as needed. Further, light within a special wavelength band, capable of promoting growth of plant, may also be generated.

Figure 8:
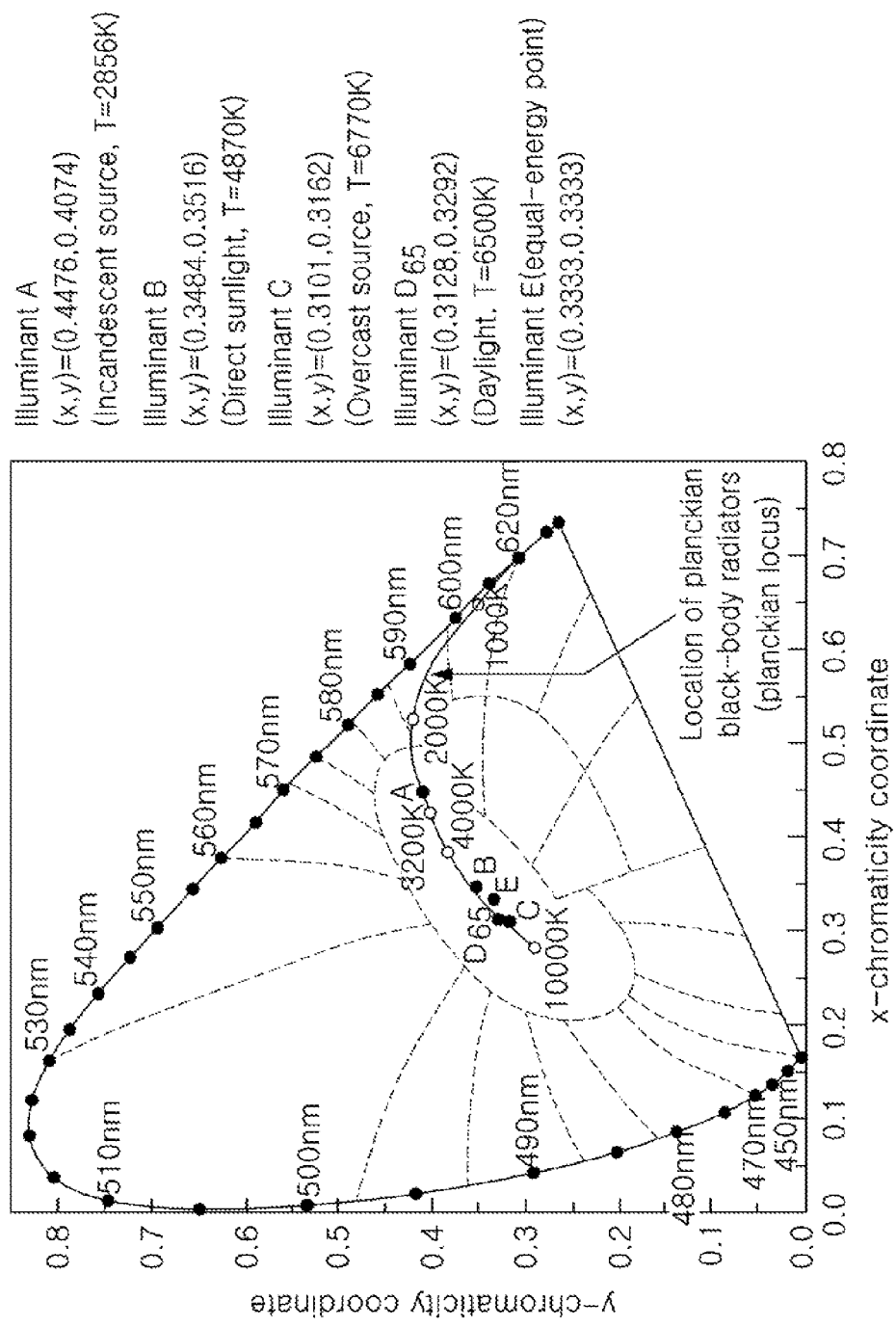
FIG. 8 illustrates a CIE1931 chromaticity coordinate system.

White light obtained by combining yellow, green, red phosphors and/or green, red LEDs with the blue LED may have two or more peak wavelengths, and coordinates (x, y) of the CIE 1931 chromaticity coordinate system illustrated in FIG. 8 may be located on line segments (0.4476, 0.4074), (0.3484, 0.3516), (0.3101, 0.3162), (0.3128, 0.3292), and (0.3333, 0.3333) connected to one another. Alternatively, the coordinates (x, y) may be located in a region surrounded by the line segments and black body radiation spectrum. A color temperature of the white light may be in a range of about 2000K to 20000K.

Phosphors may be represented by the following empirical formulae and have a color as below.

Oxide-based Phosphor: Yellow and green $Y_3Al_5O_{12}$:Ce, $Tb_3Al_5O_{12}$:Ce, $Lu_3Al_5O_{12}$:Ce Silicate-based Phosphor: Yellow and green $(Ba,Sr)_2SiO_4$:Eu, Yellow and yellowish-orange $(Ba,Sr)_3SiO_5$:Ce Nitride-based Phosphor: Green β-SiAlON:Eu, Yellow $La_3Si_6N_{11}$:Ce, Yellowish-orange α-SiAlON:Eu, Red $CaAlSiN_3$:Eu, $Sr_2Si_5N_8$:Eu, $SrSiAl_4N_7$:Eu Fluoride-based Phosphor: KSF-based red $K_2SiF_6$:Mn4+

A composition of phosphors should basically coincide with stoichiometry, and respective elements may be substituted with other elements in respective groups of the periodic table of elements. For example, Sr may be substituted with Ba, Ca, Mg, or the like, of an alkaline earth group II, and Y may be substituted with lanthanum-based Tb, Lu, Sc, Gd, or the like. In addition, Eu or the like, an activator, may be substituted with Ce, Tb, Pr, Er, Yb, or the like, according to a required level of energy, and an activator alone or a sub-activator or the like, for modification of characteristics thereof, may additionally be used.

In addition, as a phosphor substitute, materials such as a quantum dot (QD) or the like may be used, and a phosphor and a quantum dot alone, or a mixture thereof, may be used.

The quantum dot (QD) may be configured in a structure including a core (diameter of about 3 nm to 10 nm) formed using CdSe, InP, or the like, a shell (thickness of about 0.5 nm to 2 nm) formed using ZnS, ZnSe, or the like, and a ligand for stabilization of the core and the shell, and may implement various colors depending on the size thereof.

The reflective unit 200 may be provided as a frame structure corresponding to a body of the light emitting device package 10 and may protect the light emitting device 100 while supporting the optical device 300 to be described below.

The reflective unit 200 may have a first surface 201 formed to be flat and a second surface 202 opposing the first surface 201 and formed to be flat, and may have a through hole 203 formed in a central portion thereof through which an optical axis Z passes to penetrate through the first and second surfaces 201 and 202. The first and second surfaces 201 and 202 may be defined as an upper surface and a bottom surface of the reflective unit 200, respectively. Lateral surfaces connecting the first and second surfaces 201 and 202 may be symmetrical with respect to the optical axis Z.

The through hole 203 may have a transversal cross section corresponding to a horizontal cross-sectional shape of the light emitting device 100. The light emitting device 100 and the wavelength conversion layer 110 may be disposed within the through hole 203 to have a structure exposed to the first surface 201 and the second surface 202.

The first surface 201 and the second surface 202 may be parallel to each other, and a thickness of the reflective unit 200 corresponding to an interval between the first and second surfaces 201 and 202 may correspond to a total of thicknesses of the light emitting device 100 and the wavelength conversion layer 110. Thus, an upper surface of the wavelength conversion layer 110 may be provided as a surface coplanar with the first surface 201 of the reflective unit 200, and a bottom surface of the light emitting device 100 may be provided as a surface coplanar with the second surface 202 of the reflective unit 200. Here, the upper surface of the wavelength conversion layer 110 exposed to the first surface 201 may define a light emission surface of the light emitting device package 10 in the through hole 203 of the reflective unit 200.

The reflective unit 200, together with the wavelength conversion layer 110, surrounding the light emitting device 100 may allow light emitted from the light emitting device 100 in a lateral direction thereof to be reflected and emitted in a required direction, for example, in a direction toward the light emission surface.

The reflective unit 200 may be formed of a material having relatively high light reflectivity to improve light reflection characteristics, and for example, formed using $TiO_2$, white molding compound, FR-4, CEM-3, an epoxy material, a ceramic material, or the like. Such a white molding compound may contain a thermosetting resin-based material having high heat resistance or a silicone resin-based material. In addition, a white pigment and a filling material, a hardener, a mold release agent, an antioxidant, an adhesion improver, or the like, may be added to a thermoplastic resin-based material, such that light emitted in the light emitting device 100 may be reflected and an amount of light emitted through the light emission surface may be increased.

The optical device 300 may be disposed on the first surface 201 of the reflection unit 200 and may have a structure covering the light emitting device 100.

A thickness of the optical device 300 may increase in a direction parallel to the first surface 201 of the reflective unit 200 and away from the central portion of the reflective unit 200. An outer circumferential shape of the optical device may be a circular shape and the direction may be a radial direction of the circular shape. That is, lateral surfaces of the optical device 300 may be symmetrical with respect to the optical axis Z. The optical device 300 may adjust an angle of beam spread of light generated by the light emitting device 100 and emitted externally. For example, the optical device 300 may include a wide beam spread lens implementing a wide angle in a spread of light beams by allowing the light beams to be spread. However, the optical device 300 according to the exemplary embodiment in the present disclosure may have a difference, in that a general wide beam spread lens allows light to be refracted and emitted externally, while light generated by the light emitting device 100 according to the exemplary embodiment in the present disclosure may be partially reflected and emitted externally simultaneously with being emitted externally via partial transmission and partial refraction thereof.

The optical device 300 may have a third surface 301 facing the first surface 201 of the reflective unit 200, a fourth surface 302 disposed above the third surface 301, and a fifth surface 303 connecting the third surface 301 to the fourth surface 302. The third surface 301 and the fourth surface 302 may define a bottom surface and an upper surface of the optical device 300, respectively. The fifth surface 303 may be defined by a lateral surface of the optical device 300. In addition, the third surface 301 may be defined as a light incident surface on which light from the light emitting device 100 is incident, and the fourth surface 302 and the fifth surface 303 may be defined as light emission surfaces through which the light is emitted externally.

The third surface 301 of the optical device 300 may be disposed on the first surface 201 of the reflective unit 200 to be bonded thereto. The optical device 300 and the reflective unit 200 may directly contact with each other. Light from the light emitting device 100 may penetrate through the third surface 301 to be incident into the optical device 300.

The fifth surface 303 of the optical device 300 may be extended from an edge of the third surface 301 to be almost perpendicular thereto. An outer circumferential surface of the reflective unit 200 may be tangent to the fifth surface 303 of the optical device 300. For example, as illustrated in FIG. 3B, the lateral surface of the reflective unit 200 and at least one lateral surface of the optical device 300 may be continuously connected.

The fourth surface 302 of the optical device 300 may have a structure recessed from an edge thereof connected to the fifth surface 303 to a center thereof through which the optical axis Z passes. For example, the fourth surface 302 may have a structure in which a central portion thereof is concave, for example, a funnel shaped structure.

Figure 4A:
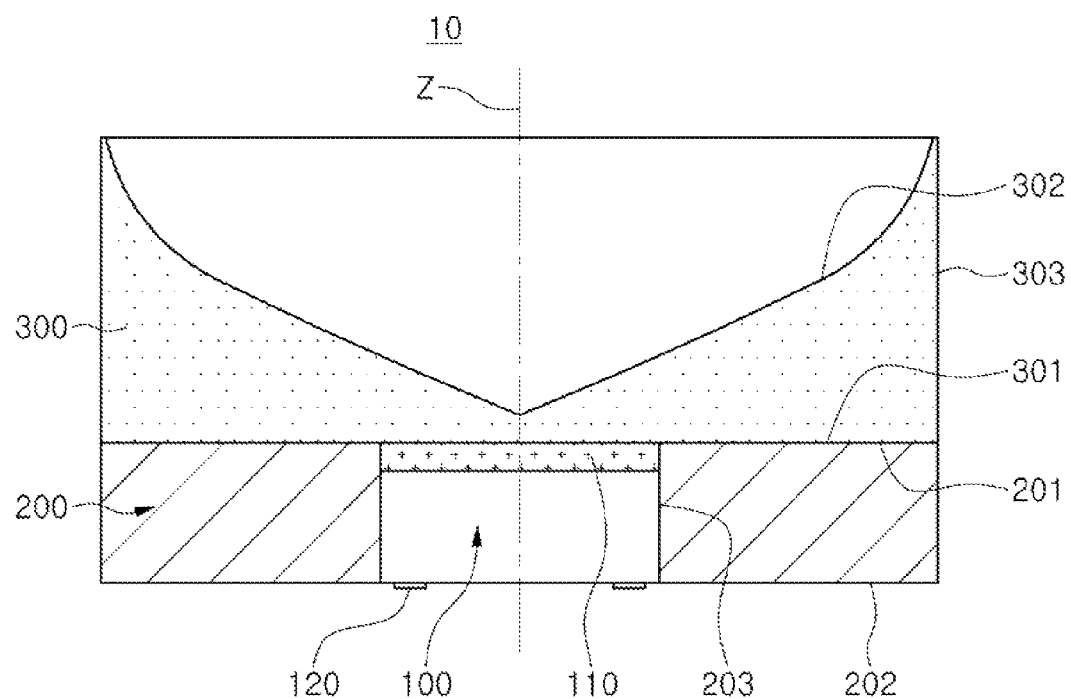
FIGS. 4A and 4B are schematic cross sectional views illustrating modification examples of an optical device for use in the light emitting device package of FIG. 1.
Figure 4B:
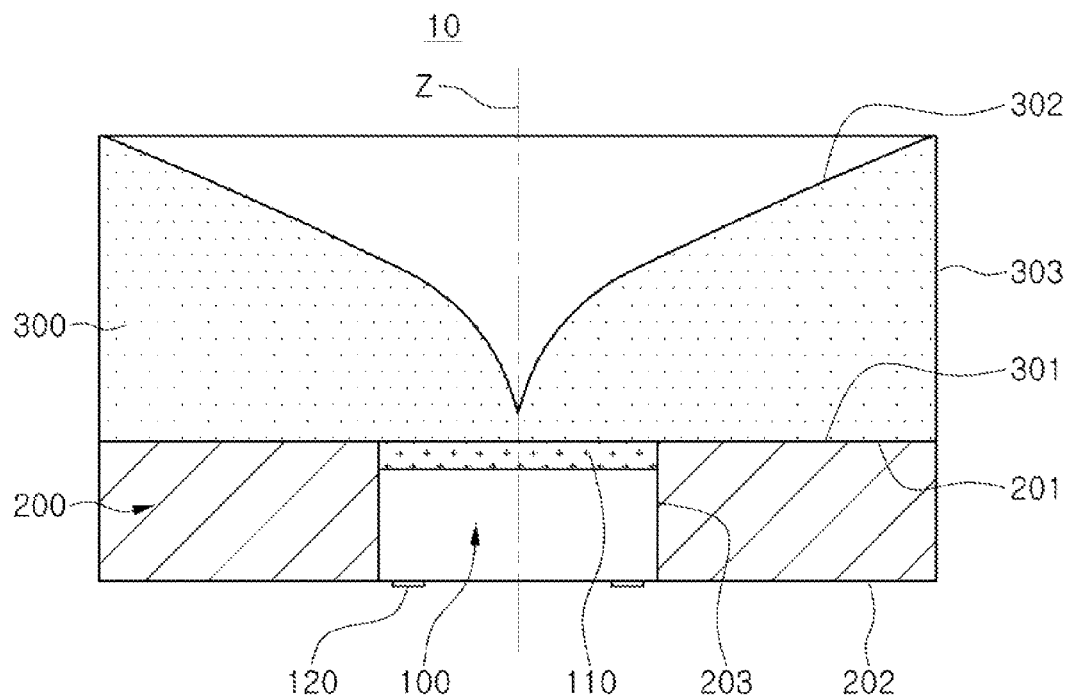

As illustrated in FIGS. 2 and 3B, the fourth surface 302 may have a structure in which a vertical cross section thereof has a linearly extended form, but is not limited thereto. For example, the fourth surface 302 may have a vertical cross section having an extended curve shape as illustrated in FIGS. 4A and 4B.

Figure 5A:
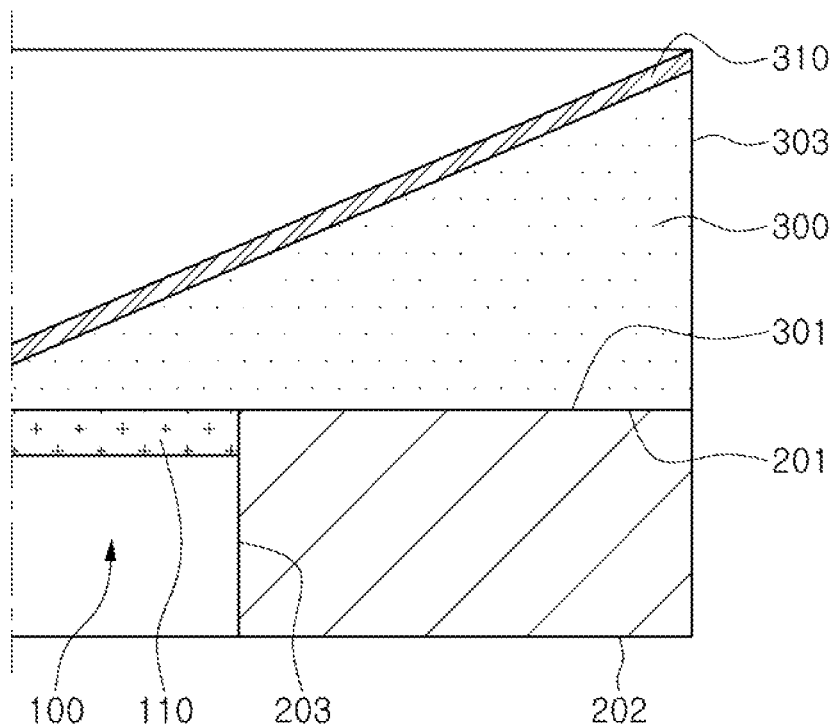
FIGS. 5A and 5B are cross sectional views schematically illustrating a reflective layer provided on the optical device in the light emitting device package of FIG. 1.
Figure 5B:
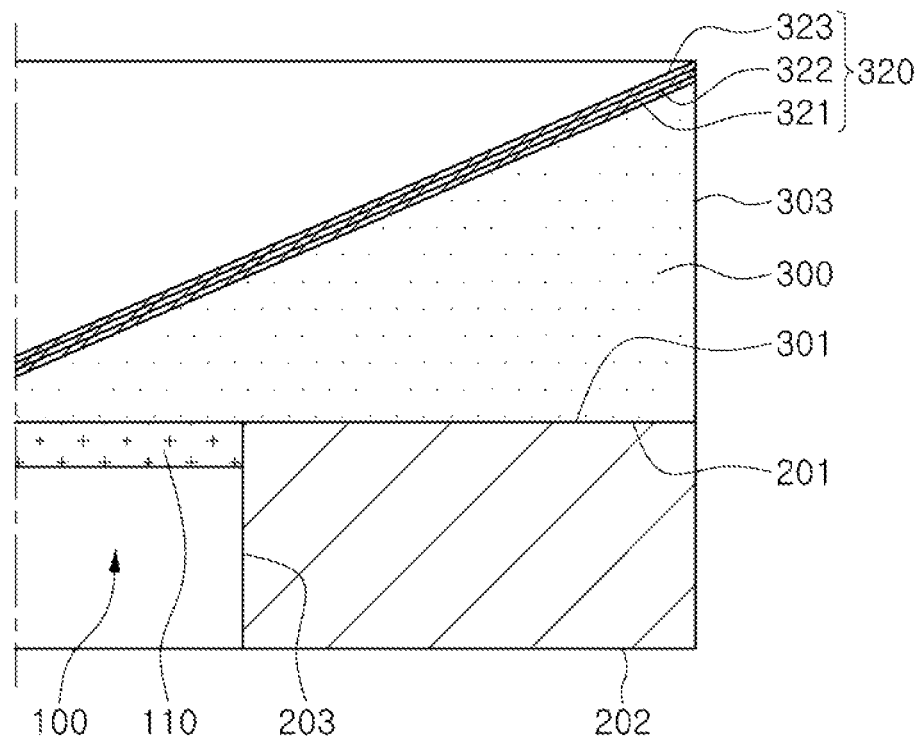

FIGS. 5A and 5B schematically illustrate a reflective layer provided on the optical device 300.

As illustrated in FIG. 5A, a reflective layer 310 having partial reflection and partial transmission of light may be provided on the fourth surface 302 of the optical device 300. Thus, the fourth surface 302 may allow a portion of light emitted by the light emitting device 100 and incident through the third surface 301, to be transmitted directly through an upper portion thereof and emitted externally while allowing a portion of the light to be reflected toward the fifth surface 303 and externally emitted through the fifth surface 303.

As illustrated in FIG. 5A, the reflective layer 310 may be formed as a metal layer formed using a metal such as chrome (Cr), silver (Ag), nickel (Ni), aluminum (Al), or the like. The reflective layer 310 may cover the fourth surface 302 via, for example, coating, or cover the fourth surface 302 via a bonding scheme in which the reflective layer 310 is bonded thereto in a thin film form.

As illustrated in FIG. 5B, a reflective layer 320 may have a structure in which a plurality of transparent layers 321, 322 and 323 having different refractive indices are stacked. In this case, the plurality of transparent layers 321, 322 and 323 may be stacked to have a structure in which refractive indices thereof are gradually increased, such that the light may be partially reflected and transmitted via a Bragg reflection phenomenon.

The exemplary embodiment in the present disclosure illustrates the structure in which the reflective layer 310/320 entirely covers the fourth surface 302, but is not limited thereto. For example, the reflective layer 310/320 may have a structure partially covering the fourth surface 302.

The optical device 300 may be formed using a resin material having light transmitting properties and may contain, for example, polycarbonate (PC), polymethyl methacrylate (PMMA), acryl, or the like. The optical device 300 may also be formed using a glass material, but is not limited thereto.

The optical device 300 may contain a light dispersion material in a range of around 3% to 15%. As the light dispersion material, one or more selected from a group consisting of, for example, $SiO_2$, $TiO_2$ and $Al_2O_3$ may be used. In a case in which the light dispersion material is contained in a content of less than 3%, light may not be sufficiently distributed such that light dispersion effects may not be expected. In addition, in a case in which the light dispersion material is contained in a content of more than 15%, an amount of light emitted outwardly from the optical device 300 may be reduced, thus deteriorating light extraction efficiency.

The optical device 300 may have width at least the same or smaller than that of the reflective unit 200, and the light emitting device 100 may have width smaller than that of the optical device 300.

As such, the light emitting device package 10 according to the exemplary embodiment in the present disclosure may have the structure in which the reflective unit 200 corresponding to a package body has a relatively low thickness so as to correspond to a level of an LED chip and the optical device 300 corresponding to a secondary lens is integrated with the package, so that the size of the light emitting device package may be miniaturized to a chip size level. Thus, compared to a case in which a secondary lens according to the related art is mounted on a PCB separately from a package, an area occupied by the light emitting device package according to the exemplary embodiment in the present disclosure may be reduced. In addition, problems caused by mounting a secondary lens on a PCB in the structure according to the related art may be prevented.

Further, as the optical device 300 according to the exemplary embodiment in the present disclosure may implement optical properties such as the partial reflection and partial transmission of light, limitations of the optical device reduced in size as compared to that of a secondary lens according to the related art may be reduced, for example, a relatively wide beam angle may be implemented.

Figure 6:
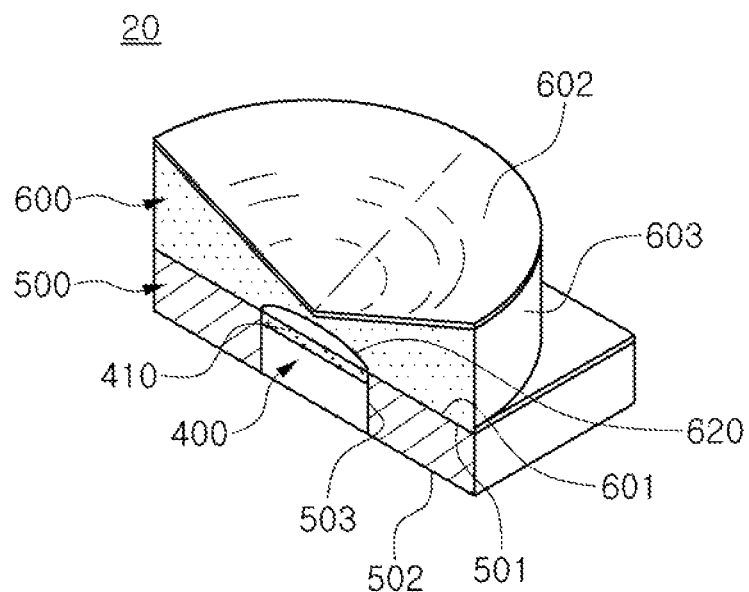
FIG. 6 is a schematic cutaway perspective view of a light emitting device package according to another exemplary embodiment in the present disclosure.

A light emitting device package according to another exemplary embodiment in the present disclosure will be described with reference to FIGS. 6 and 7. FIG. 6 is a schematic cutaway perspective view of a light emitting device package according to another exemplary embodiment in the present disclosure, and FIG. 7 is a cross sectional view of FIG. 6.

A structure configuring a light emitting device package according to an exemplary embodiment in the present disclosure, illustrated with reference to FIGS. 6 and 7, may be substantially the same as that of the exemplary embodiment in the present disclosure with reference to FIGS. 1 to 5 in terms of a basic structure. However, since a structure of the optical device is different from that of the exemplary embodiment in the present disclosure with reference to FIGS. 1 to 5, a description thereof overlapping the description of the exemplary embodiment of the present disclosure with reference to FIGS. 1 to 5 will be omitted below, and the structure of the optical device will mainly be described hereinafter.

Figure 7:
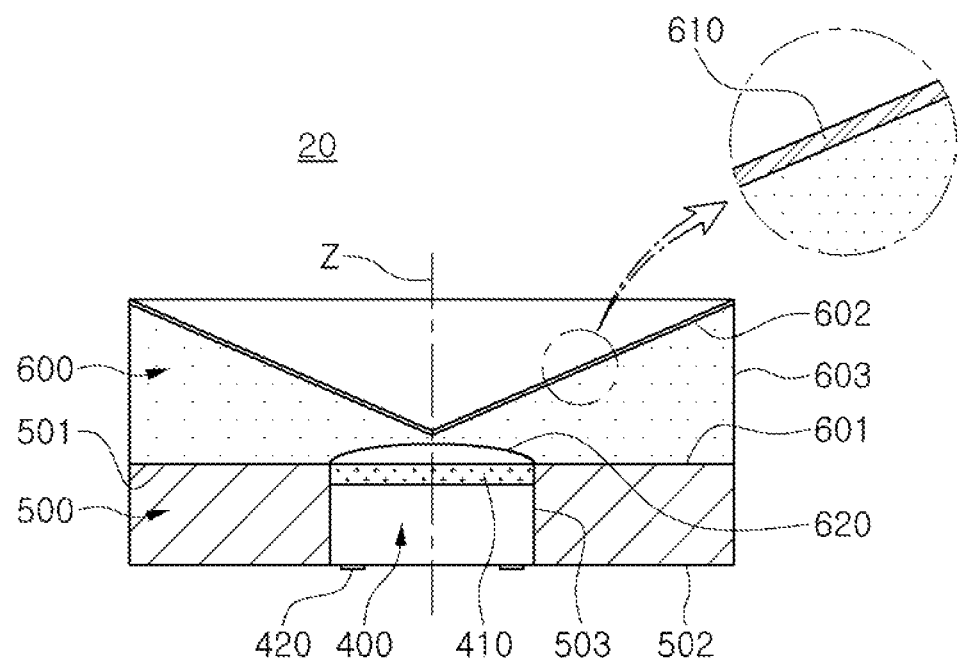
FIG. 7 is a cross sectional view of FIG. 6.

As illustrated in FIGS. 6 and 7, a light emitting device package 20 according to an exemplary embodiment in the present disclosure may include a light emitting device 400, a reflective unit 500, and an optical device 600.

The light emitting device 400 may be provided as an electroluminescence device generating light having a predetermined wavelength by drive power applied externally. For example, the light emitting device 400 may include a semiconductor light emitting diode (LED) having an n-type semiconductor layer and a p-type semiconductor layer, and an active layer disposed therebetween.

As the light emitting device 400, light emitting diode (LED) chips having various structures may be used. Configurations and structures of the light emitting device 400 will be described in detail below.

A wavelength conversion layer 410 may be provided on an upper surface of the light emitting device 400 to cover the light emitting device 400. At least one pair of electrode pads 420 may be provided on a lower surface of the light emitting device 400 to be electrically connected to an external power source.

The reflective unit 500 may have a first surface 501 formed to be flat and a second surface 502 opposing the first surface 501 and formed to be flat, and may have a through hole 503 formed in a central portion thereof to penetrate through the first and second surfaces 501 and 502. The first and second surfaces 501 and 502 may be defined as an upper surface and a bottom surface of the reflective unit 500, respectively.

The through hole 503 may have a transversal cross section corresponding to a horizontal cross-sectional shape of the light emitting device 400. The light emitting device 400 and the wavelength conversion layer 410 may be disposed within the through hole 503 to have a structure exposed to the first surface 501 and the second surface 502.

The first surface 501 and the second surface 502 may be parallel to each other, and a thickness of the reflective unit 500 corresponding to an interval between the first and second surfaces 501 and 502 may correspond to a total of thicknesses of the light emitting device 400 and the wavelength conversion layer 410. Thus, an upper surface of the wavelength conversion layer 410 may be provided as a surface coplanar with the first surface 501 of the reflective unit 500, and a bottom surface of the light emitting device 400 may be provided as a surface coplanar with the second surface 502 of the reflective unit 500. Here, the upper surface of the wavelength conversion layer 410 exposed to the first surface 501 of the reflective unit 500 may define a light emission surface of the light emitting device package 20.

A structure of the reflective unit 500 is substantially the same as that of the reflective unit 200 of FIG. 1 in terms of a basic structure thereof. Thus, a detailed description thereof will be omitted.

The optical device 600 may be disposed on the first surface 501 of the reflection unit 500 and may have a structure covering the light emitting device 400.

The optical device 600 may have a third surface 601 facing the first surface 501 of the reflective unit 500, a fourth surface 602 disposed above the third surface 601, and a fifth surface 603 connecting the third surface 601 to the fourth surface 602. The third surface 601 and the fourth surface 602 may define a bottom surface and an upper surface of the optical device 600, respectively. The fifth surface 603 may be defined by a lateral surface of the optical device 600. In addition, the third surface 601 may be defined as a light incident surface on which light from the light emitting device 400 is incident, and the fourth surface 602 and the fifth surface 603 may be defined as light emission surfaces through which the light is emitted externally.

The third surface 601 of the optical device 600 may be disposed on the first surface 501 of the reflective unit 500 to be bonded thereto. The third surface 601 may have a recess portion 620 formed in a central portion thereof to have a centrally concave shape.

The recess portion 620 may be disposed directly above the light emitting device 400 to have a structure in which the recess portion 620 faces the light emitting device 400, in detail, the wavelength conversion layer 410 covering the light emitting device 400, so as to cover the wavelength conversion layer 410 exposed to the first surface 501.

The recess portion 620 may be filled with a material having a refractive index higher than that of the wavelength conversion layer 410 and lower than that of the optical device 600. Alternatively, the recess portion 620 may also be filled with air.

Light from the light emitting device 400 may be incident into the optical device 600 via the recess portion 620.

The fifth surface 603 of the optical device 600 may be extended from an edge of the third surface 601 to be perpendicular thereto. An outer surface of the reflective unit 500 may be tangent to the fifth surface 603 of the optical device 600.

The fourth surface 602 of the optical device 600 may have a structure recessed from an edge thereof connected to the fifth surface 603 toward a center thereof through which the optical axis Z passes. For example, the fourth surface 602 may have a funnel shaped structure in which a central portion thereof is concave.

A reflective layer 610 having partial reflection and partial transmission of light may be provided on the fourth surface 602. Thus, the fourth surface 602 may allow a portion of light emitted by the light emitting device 400 and incident through the recess portion 620 of the third surface 601, to be transmitted directly through an upper portion thereof and emitted externally while allowing a portion of the light to be reflected toward the fifth surface 603 and externally emitted through the fifth surface 603.

Figure 9:
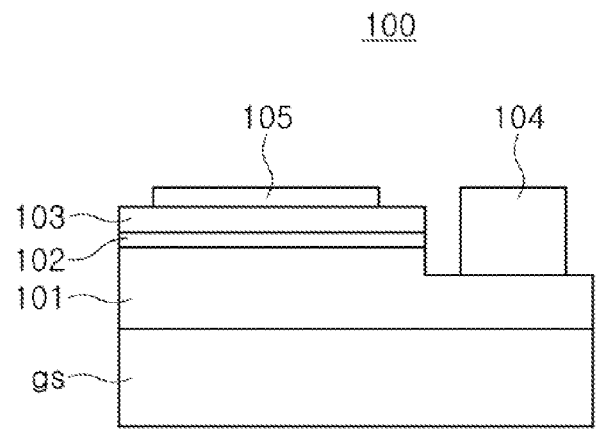
FIGS. 9 to 11 are cross sectional views illustrating various examples of LED chips employed in a light emitting device according to an exemplary embodiment in the present disclosure.
Figure 10:
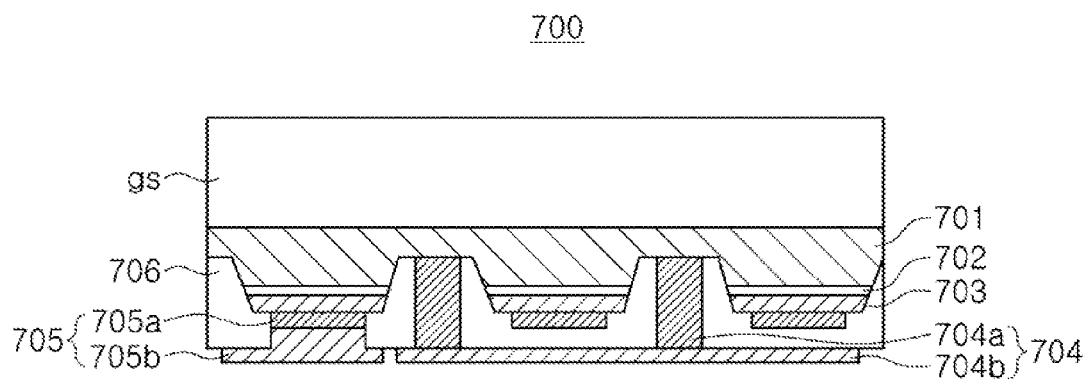
Figure 11:
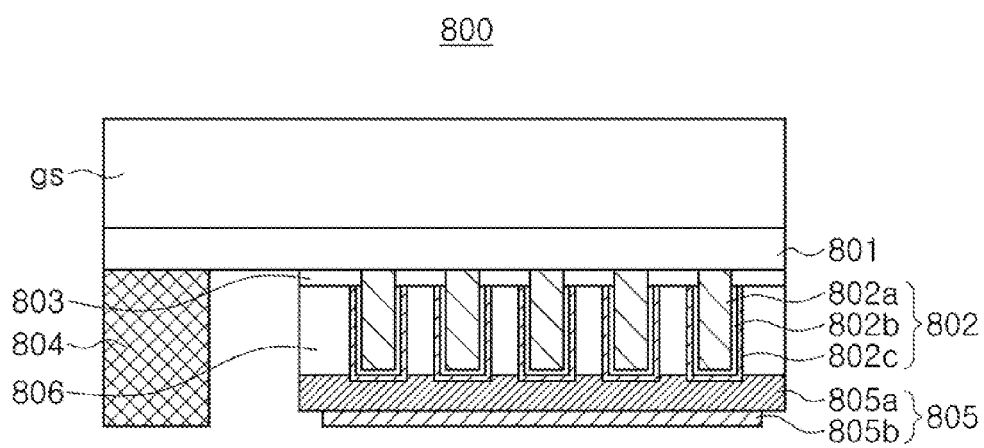

Various exemplary embodiments of LED chips being used as light emitting devices according to the present disclosure will be described with reference to FIGS. 9 to 11. FIGS. 9 to 11 are cross sectional views illustrating various examples of LED chips used as light emitting devices.

With reference to FIG. 9, an LED chip 100 may include a first conductivity type semiconductor layer 101, an active layer 102 and a second conductivity type semiconductor layer 103 sequentially stacked on tops of each other on a growth substrate gs.

The first conductivity-type semiconductor layer 101 stacked on the growth substrate gs may be provided as an n-type nitride semiconductor layer doped with an n-type impurity. The second conductivity-type semiconductor layer 103 may be provided as a p-type nitride semiconductor layer doped with a p-type impurity. However, according to an exemplary embodiment in the present disclosure, locations of the first and second conductivity-type semiconductor layers 101 and 103 in a scheme in which they are stacked on each other may also be reversed. The first and second conductivity-type semiconductor layers 101 and 103 may be formed using a material represented by an empirical formula $Al_xIn_yGa_{(1-x-y)}N$ ($0 \leq x < 1$, $0 \leq y < 1$, $0 \leq x+y < 1$), such as GaN, AlGaN, InGaN, AlInGaN, or the like.

The active layer 102 disposed between the first and second conductivity-type semiconductor layers 101 and 103 may emit light having a predetermined level of energy through the recombination of electrons and holes. The active layer 102 may contain a material having an energy band gap smaller than those of the first and second conductivity-type semiconductor layers 101 and 103. For example, when the first and second conductivity-type semiconductor layers 101 and 103 are configured of a GaN-based compound semiconductor, the active layer 102 may include an InGaN-based compound semiconductor having an energy band gap smaller than that of GaN. In addition, the active layer 102 may have a multiple quantum well (MQW) structure in which a quantum well layer and a quantum barrier layer are alternately stacked, for example, an InGaN/GaN structure, but is not limited thereto. Thus, the active layer 102 may have a single quantum well structure (SQW).

The LED chip 100 may include first and second electrode pads 104 and 105 respectively and electrically connected to the first and second conductivity-type semiconductor layers 101 and 103. The first and second electrode pads 104 and 105 may be exposed and disposed so as to be located in a same direction, and further, may be electrically connected to a substrate in a wire bonding scheme or a flip-chip bonding scheme (not shown in FIG. 9).

An LED chip 700 illustrated in FIG. 10 may include a semiconductor laminate formed on a growth substrate gs. The semiconductor laminate may include a first conductivity-type semiconductor layer 701, an active layer 702, and a second conductivity-type semiconductor layer 703.

The LED chip 700 may include first and second electrode pads 704 and 705 respectively connected to the first and second conductivity-type semiconductor layers 701 and 703. The first electrode pad 704 may include a conductive via 704a penetrating through the second conductivity-type semiconductor layer 703 and the active layer 702 to be connected to the first conductivity-type semiconductor layer 701, and an electrode extension portion 704b connected to the conductive via 704a. The conductive via 704a may be surrounded by an insulating layer 706 to be electrically isolated from the active layer 702 and the second conductivity-type semiconductor layer 703. The conductive via 704a may be disposed in a region thereof in which the semiconductor laminate has been etched. The number, a shape, and a pitch of the conductive vias 704a, or a contact area thereof with the first conductivity-type semiconductor layer 701, and the like, may be appropriately designed, such that contact resistance is reduced. In addition, the conductive vias 704a may be arranged so that rows and columns thereof may be formed on the semiconductor laminate, thereby improving current flow. The second electrode pad 705 may include an ohmic contact layer 705a formed on the second conductivity-type semiconductor layer 703, and an electrode extension portion 705b.

An LED chip 800 illustrated in FIG. 11 may include a growth substrate gs, a first conductivity-type semiconductor base layer 801 formed on the growth substrate gs, and a plurality of light emitting nanostructures 802 formed on the first conductivity-type semiconductor base layer 801. The LED chip 800 may further include an insulating layer 803 and a filling portion 806.

The light emitting nanostructure 802 may include a first conductivity-type semiconductor core 802a, and an active layer 802b and a second conductivity-type semiconductor layer 802c which are sequentially formed as shell layers on a surface of the first conductivity-type semiconductor core 802a.

The exemplary embodiment of the present disclosure illustrates the case in which the light emitting nanostructure 802 has a core-shell structure, but is not limited thereto, and may have various structures such as a pyramid structure. The first conductivity-type semiconductor base layer 801 may serve as a layer providing a growth surface of the light emitting nanostructure 802. The insulating layer 803 may provide an open region for the growth of the light emitting nanostructure 802, and may be formed using a dielectric material such as $SiO_2$ or $SiN_x$. The filling portion 806 may serve to structurally stabilize the light emitting nanostructures 802 and may serve to allow light to penetrate therethrough or be reflected therefrom. In a manner different therefrom, in a case in which the filling portion 806 contains a light transmitting material, the filling portion 806 may be formed using a transparent material such as $SiO_2$, SiNx, an elastic resin, silicon, an epoxy resin, a polymer, a plastic material, or the like. As necessary, in a case in which the filling portion 806 contains a reflective material, a metal powder or a ceramic powder having a high degree of reflectivity may be used in a polymer material such as polypthalamide (PPA) or the like, in the filling portion 806. As the high reflectivity ceramic material, at least one selected from a group consisting of $TiO_2$, $Al_2O_3$, $Nb_2O_5$, $Al_2O_3$ and ZnO may be used. In a manner different therefrom, high reflectivity metal may also be used, and a metal such as Al or Ag may be used.

The first and second electrode pads 804 and 805 may be disposed on lower surfaces of the light emitting nanostructures 802. The first electrode pad 804 may be disposed on an exposed surface of the first conductivity-type semiconductor base layer 801, and the second electrode pad 805 may include an ohmic contact layer 805a formed below the light emitting nanostructures 802 and the filling portion 806, and an electrode extension portion 805b. In a manner different therefrom, the ohmic contact layer 805a and the electrode extension portion 805b may be integrated with each other.

With reference to FIGS. 12 to 15, a method of manufacturing a light emitting device package according to an exemplary embodiment in the present disclosure will be described. FIGS. 12 to 15 are views schematically illustrating respective processes of a method of manufacturing a light emitting device package according to an exemplary embodiment in the present disclosure.

Figure 12:
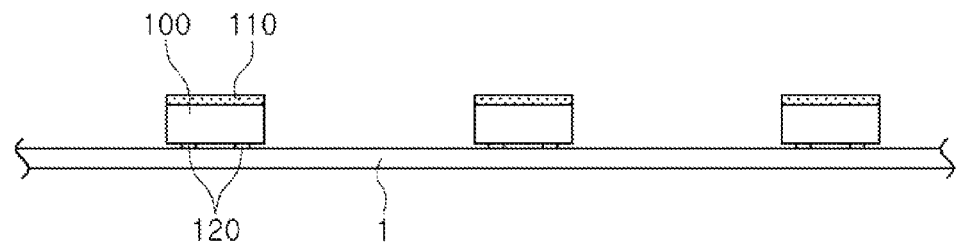
FIGS. 12 to 15 are views schematically illustrating respective processes of a method of manufacturing a light emitting device package according to an exemplary embodiment in the present disclosure.

As illustrated in FIG. 12, a plurality of light emitting devices 100 may be arranged on a support substrate 1. The plurality of light emitting devices 100 may be arranged with a predetermined interval therebetween.

Each of the plurality of light emitting devices 100 may be provided with electrode pads 120 disposed on bottom surfaces thereof facing the support substrate 1. In addition, wavelength conversion layers 110 may be disposed on upper surfaces of the plurality of light emitting devices 100.

Figure 13:
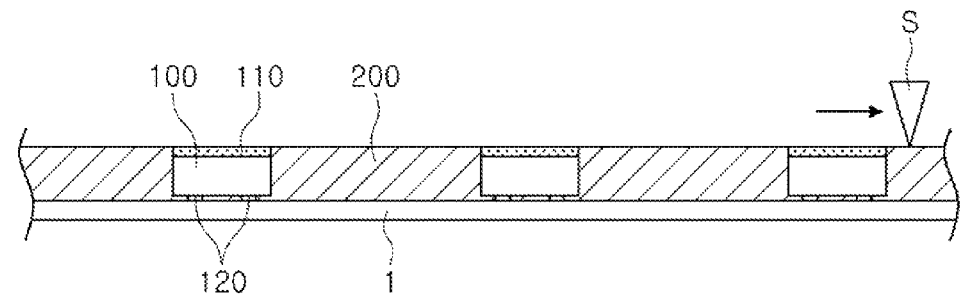

FIG. 13 illustrates a process of forming a reflective unit 200 on the support substrate 1 to surround each of the light emitting devices 100 between the plurality of light emitting devices 100.

The reflective unit 200 may be formed in a manner in which spaces between the plurality of light emitting devices 100 are filled with a reflective unit molding material having mobility, for example, $TiO_2$, a white molding compound, FR-4, CEM-3, an epoxy, a ceramic, or the like.

The reflective unit 200 may be formed by filling spaces between the plurality of light emitting devices 100 with the reflective molding material via a screen printing process using a squeezer S for example, to then be cured.

Figure 14A:
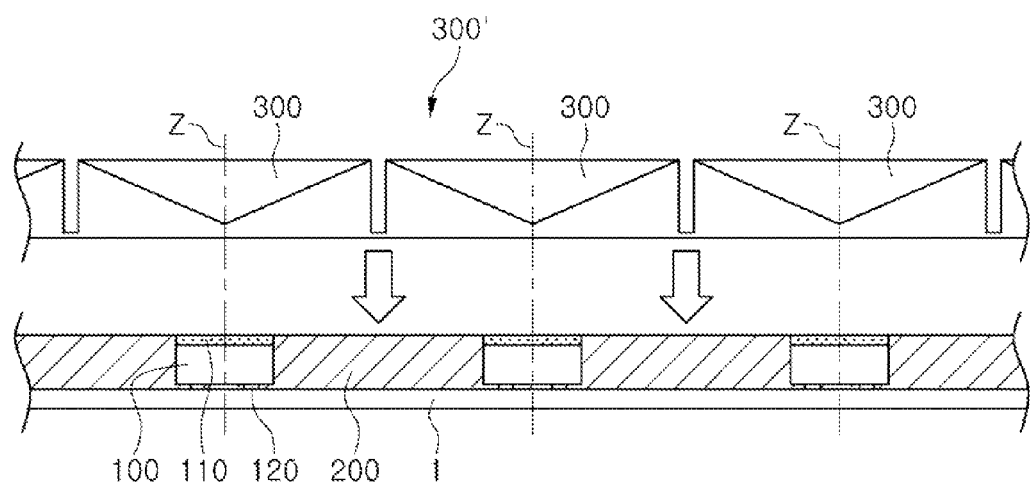
Figure 14B:
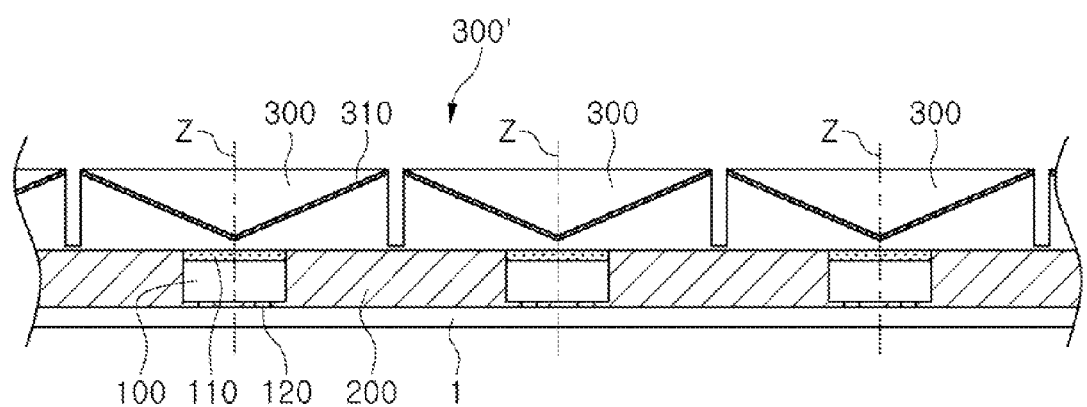

FIGS. 14A and 14B illustrate a process in which respective optical devices 300 are disposed on the reflective unit 200 surrounding the corresponding light emitting devices 100 so as to cover the respective light emitting devices 100.

In detail, a lens sheet 300' on which a plurality of optical devices 300 are arranged to correspond to the plurality of light emitting devices 100 may be separately prepared, and the lens sheet 300' may be attached to the reflective unit 200 so that the plurality of optical devices 300 may be disposed directly on upper portions of the plurality of respective light emitting devices 100.

The respective optical device 300 may have a structure in which an upper surface thereof is recessed toward a center thereof through which the optical axis Z passes. The optical device 300 has a basic structure substantially identical to that of the optical device 300 of FIG. 1. Thus, a detailed description thereof will be omitted.

The lens sheet 300' may be formed in a manner of injecting a liquid solvent into a mold to then be solidified, for example, via injection molding, transfer molding, compression molding, or the like.

The exemplary embodiment in the present disclosure illustrates the case in which the optical devices 300 are respectively disposed above the light emitting devices 100 in the scheme in which the lens sheet 300' on which the plurality of optical devices 300 are arranged is attached to the reflective unit 200 simultaneously, but is not limited thereto. For example, the optical devices 300 may be attached thereto, individually, to be disposed on the respective light emitting devices 100.

On the other hand, a process of forming a reflective layer 310 on respective upper surfaces of the optical devices 300 may be performed after the optical devices 300 are attached.

The reflective layers 310 may be used for allowing for partial reflection and partial transmission of light emitted by the light emitting devices 100 so as to prevent the occurrence of dark place on an upper part thereof via the partial transmission of light, and lateral directional characteristics of light may be improved via the partial reflection of light.

The reflective layer may be provided as a metal layer formed of a metal such as chrome (Cr), silver (Ag), nickel (Ni), aluminum (Al), or the like. The reflective layer may cover the fourth surface via, for example, coating, or may cover the fourth surface in a manner of attaching the reflective layer having a thin film form thereto.

In addition, the reflective layer may have a structure in which a plurality of transparent layers having different refractive indices are stacked. In this case, the plurality of transparent layers may be stacked to have a structure in which refractive indices thereof are gradually increased, and light may be partially reflected and transmitted via a Bragg reflection phenomenon.

Figure 15:
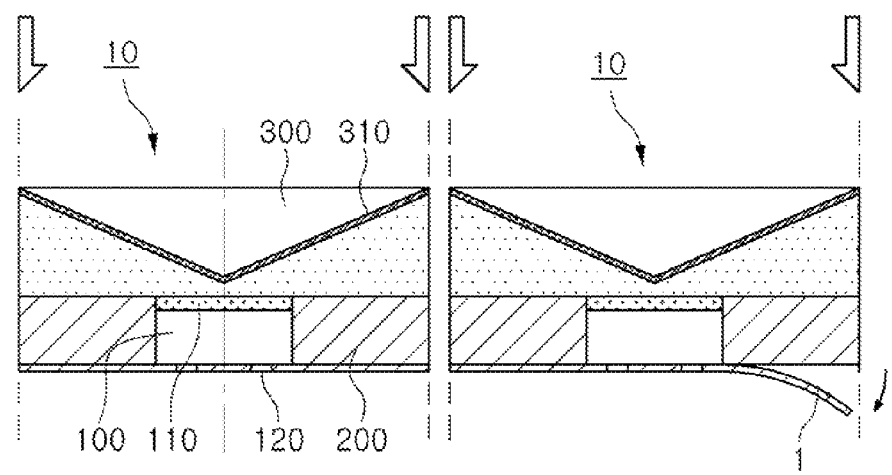

FIG. 15 illustrates a process in which the plurality of light emitting devices 100 are divided into individual light emitting device packages 10.

For example, the reflective unit 200 surrounding the respective light emitting devices 100 may be cut along a cutting line thereof using a cutting device so as to be divided into individual light emitting device packages 10. Respective single light emitting device packages 10 may be obtained by removing the divided support substrates 1 attached to bottom surfaces of the respective light emitting devices 100.

Such manufactured light emitting device packages 10 may be mounted in backlight units, lighting devices, or the like, so as to be used as light sources.

Lighting devices according to various exemplary embodiments in the present disclosure in which light emitting device packages according to exemplary embodiments in the present disclosure are employed will be illustrated with reference to FIGS. 16 to 18.

Figure 16:
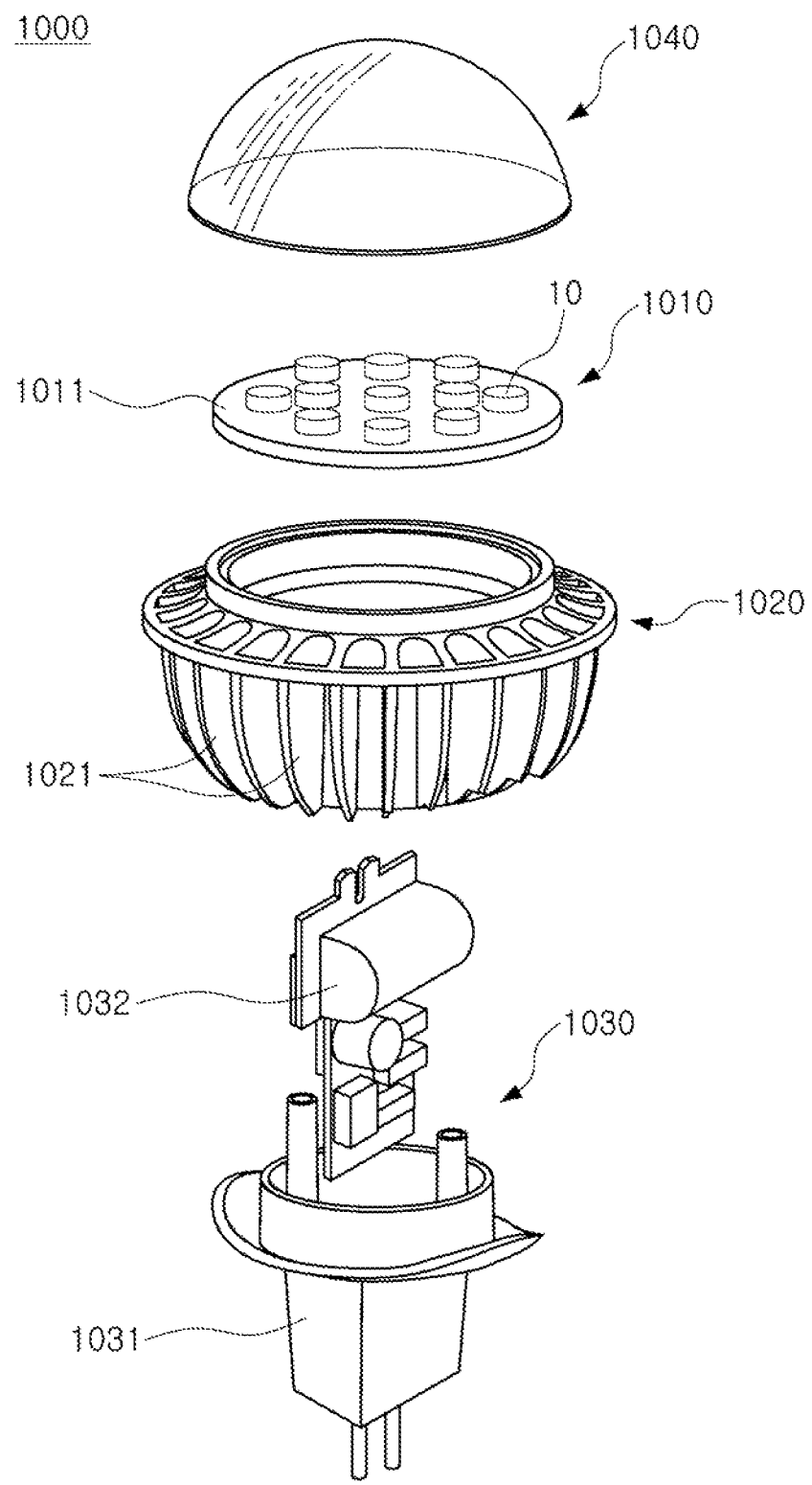
FIG. 16 is an exploded perspective view schematically illustrating a lighting device (a bulb type lamp) according to an exemplary embodiment in the present disclosure.

FIG. 16 schematically illustrates a lighting device according to an exemplary embodiment in the present disclosure.

With reference to FIG. 16, a lighting device 1000 according to an exemplary embodiment in the present disclosure may be provided as a bulb-type lamp and may be used as an apparatus for indoor lighting, for example, a downlight.

The lighting device 1000 may include a housing 1020 having an electrical connection structure 1030 therein, and a light source module 1010 installed in the housing 1020. The lighting device 1000 may further include a cover 1040 mounted on the housing 1020 to cover the light source module 1010.

The light source module 1010 may include a substrate 1011 and a plurality of light emitting device packages 10 mounted and arranged on the substrate 1011. The light emitting device package 10 is substantially identical to the light emitting device package 10 of FIG. 1, and thus, a detailed description thereof will be omitted.

The housing 1020 may serve as a frame supporting the light source module 1010 and a heat sink discharging heat generated in the light source module 1010 to the outside. To this end, the housing 1020 may be formed using a solid material having relatively high heat conductivity, for example, a metal such as aluminum (Al), a radiation resin, or the like.

The housing 1020 may include a plurality of radiation fins 1021 provided on an outer circumferential surface thereof, to allow for an increase in a contact area with surrounding air so as to improve heat radiation efficiency.

The housing 1020 may include the electrical connection structure 1030 electrically connected to the light source module 1010. The electrical connection structure 1030 may include a terminal portion 1031, and a driving portion 1032 supplying driving power to the light source module 1010 through the terminal portion 1031.

The terminal portion 1031 may allow the lighting device 1000 to be installed in, for example, a socket or the like, so as to be fixed and electrically connected thereto. The exemplary embodiment of the present disclosure illustrates the case in which the terminal portion 1031 has a pin-type structure so as to be slidably inserted, but is not limited thereto. The terminal portion 1031 may have an Edison type structure having a screw thread so that it may be rotatably inserted, as needed.

The driving portion 1032 may serve to convert external driving power into an appropriate current source capable of driving the light source module 1010 and provide the converted power. The driving portion 1032 may be configured of, for example, an alternating current (AC) to direct current (DC) converter, a rectifying circuit component, a fuse, and the like. In addition, in some cases, the driving portion 1032 may further include a communications module capable of implementing a remote control function.

The cover 1040 may be installed on the housing 1020 to cover the light source module 1010 and may have a convex lens shape or a bulb shape. The cover 1040 may be formed using a light transmitting material and may contain a light dispersion material.

Figure 17:
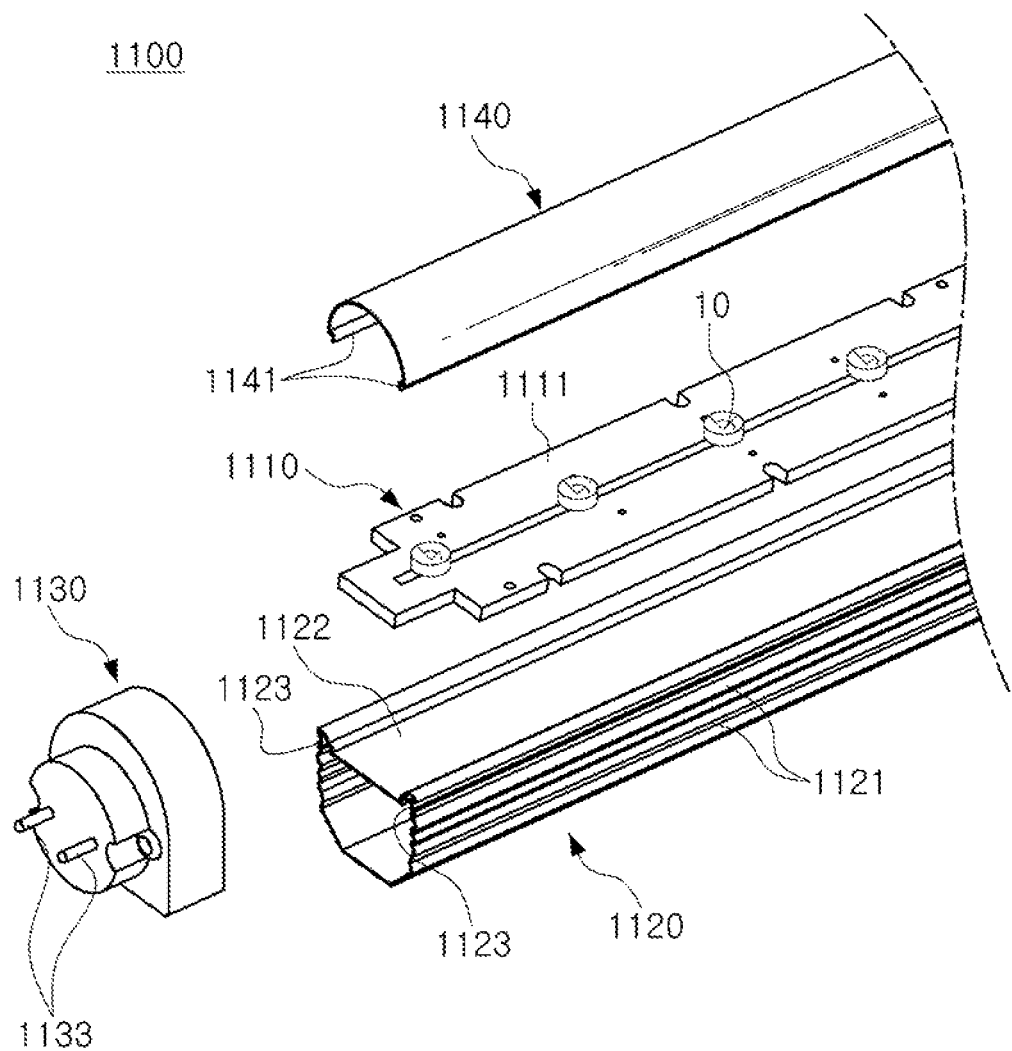
FIG. 17 is a schematic exploded perspective view of a lighting device (an L-type lamp) according to an exemplary embodiment in the present disclosure.

FIG. 17 is a schematic exploded perspective view of a lighting device according to another exemplary embodiment in the present disclosure. With reference to FIG. 17, a lighting device 1100 may be provided as a bar type lamp by way of example, and may include a light source module 1110, a housing 1120, a terminal portion 1130, and a cover 1140.

The light source module 1110 may include a substrate 1111 and a plurality of light emitting device packages 10 mounted and arranged on the substrate 1111. The light emitting device package 10 is substantially identical to the light emitting device package 10 of FIG. 1, and thus, a detailed description thereof will be omitted.

In the housing 1120, the light source module 1110 may be fixedly mounted on one surface 1122 of the housing, and the housing 1120 may allow heat generated by the light source module 1110 to be discharged to the outside. To this end, the housing 1120 may be formed using a material having excellent heat conductivity, for example, a metal, and a plurality of radiation fins 1121 may be protruded from both side surfaces thereof.

The cover 1140 may be coupled to a stop groove 1123 of the housing 1120 so as to cover the light source module 1110. In addition, the cover 1140 may have a hemispherical curved surface so as to allow for light generated by the light source module 1110 to be uniformly irradiated externally. The cover 1140 may be provided with protrusions 1141 formed on lower portions of the cover in a length direction thereof so as to be engaged with the stop groove 1123 of the housing 1120.

The terminal portion 1130 may be provided at at least one open end of both distal ends of the housing 1120 in the length direction thereof so as to supply power to the light source module 1110 and may include electrode pins 1133 protruding externally.

Figure 18:
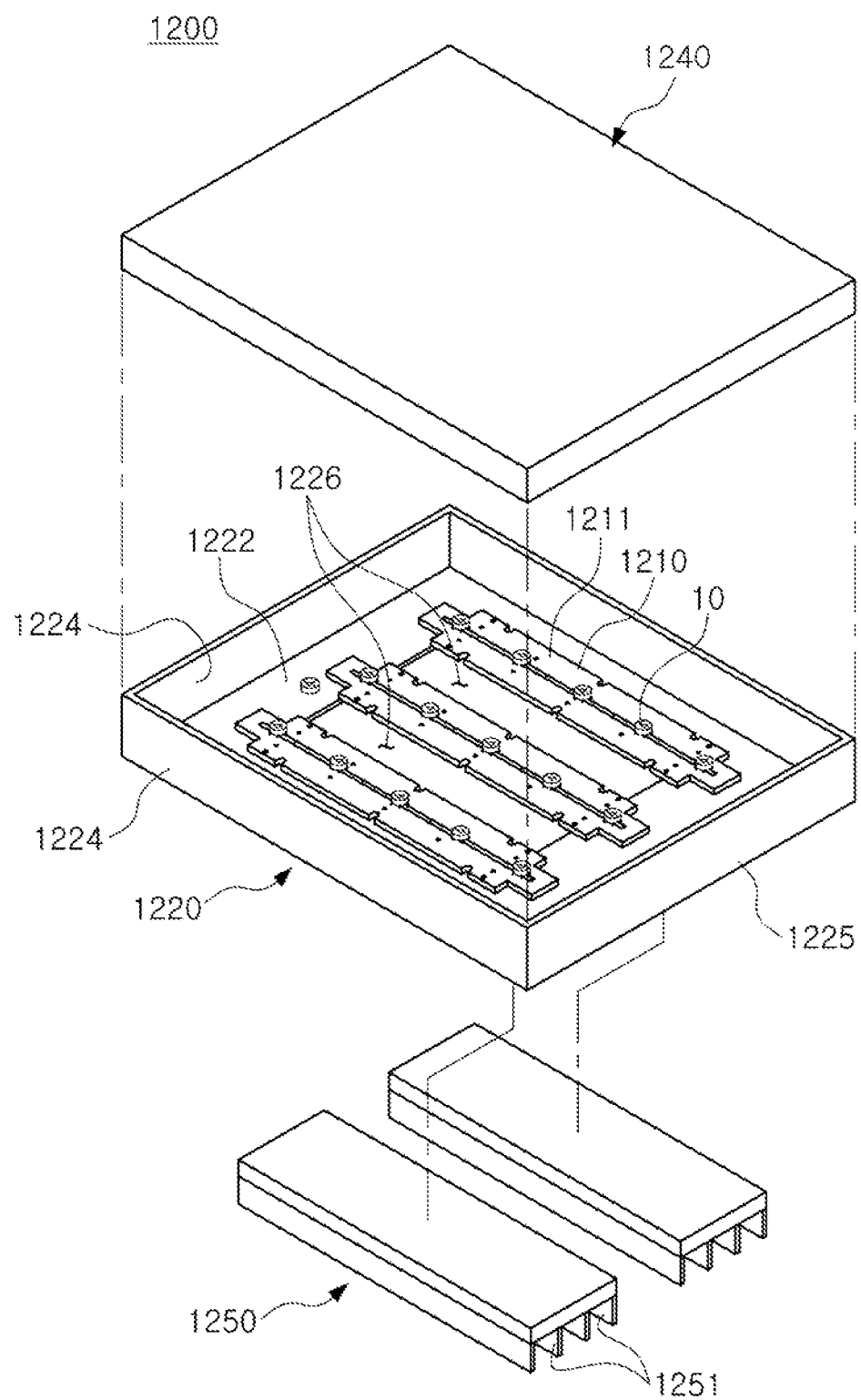
FIG. 18 is a schematic exploded perspective view of a lighting device (a flat-type lamp) according to an exemplary embodiment in the present disclosure.

FIG. 18 is a schematic exploded perspective view of a lighting device according to another exemplary embodiment in the present disclosure. With reference to FIG. 18, a lighting device 1200 may have a surface light source type structure by way of example, and may include a light source module 1210, a housing 1220, a cover 1240 and a heat sink 1250.

The light source module 1210 may include a substrate 1211 and a plurality of light emitting device packages 10 mounted and arranged on the substrate 1211. The light emitting device package 10 is substantially identical to the light emitting device package 10 of FIG. 1, and thus, a detailed description thereof will be omitted.

The housing 1220 may have a box-type structure formed by one surface 1222 thereof on which the light source modules 1210 are mounted and by sides 1224 thereof extended from edges of the one surface 1222. The housing 1220 may be formed using a material having excellent heat conductivity, for example, a metal, so as to allow heat generated by the light source modules 1210 to be discharged to the outside.

A hole 1226 through which the heat sinks 1250 to be described below are inserted to be coupled thereto may be formed to penetrate through the one surface 1222 of the housing 1220. In addition, the substrate 1211 of the light source module 1210 mounted on the one surface 1222 may be partially suspended across the hole 1226 to be exposed externally.

The cover 1240 may be coupled to the housing 1220 to cover the light source modules 1210. The cover 1240 may have a substantially flat structure.

The heat sink 1250 may be coupled to the hole 1226 through a different surface 1225 of the housing 1220. In addition, the heat sink 1250 may contact the light source modules 1210 through the hole 1226 to discharge heat of the light source modules 1210 to the outside. In order to improve heat radiation efficiency, the heat sink 1250 may include a plurality of radiation fins 1251. The heat sink 1250 may be formed using a material having excellent heat conductivity like a material of the housing 1220.

Figure 19:
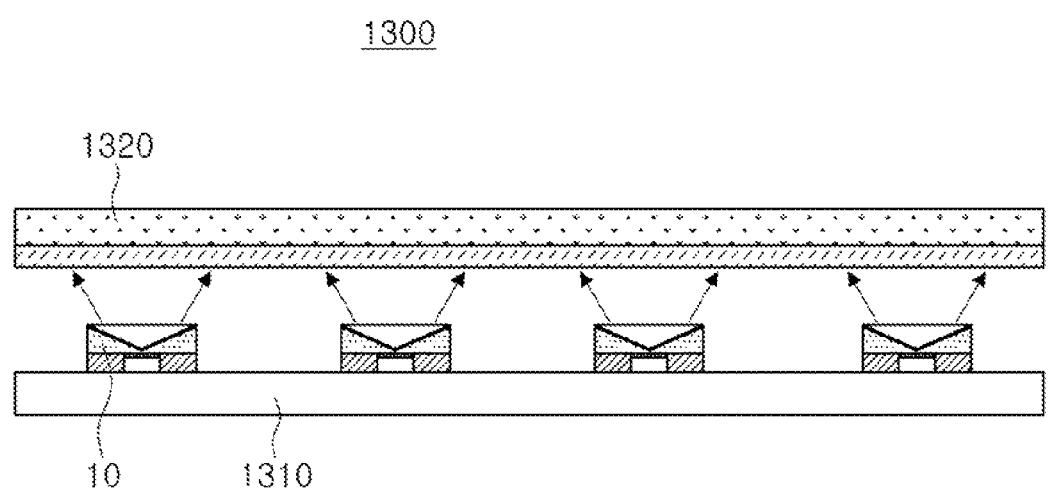
FIG. 19 is a cross sectional view illustrating an example in which a light emitting device package according to an exemplary embodiment in the present disclosure is applied to a backlight unit.

With reference to FIG. 19, a back light unit employing a light emitting device package according to an exemplary embodiment in the present disclosure therein will be described. FIG. 19 is a cross sectional view illustrating an example in which a light emitting device package according to an exemplary embodiment in the present disclosure is used.

With reference to FIG. 19, a back light unit 1300 according to an exemplary embodiment in the present disclosure may include a housing 1310 in which a plurality of light emitting device packages 10 are mounted, and an optical sheet 1320 disposed above the housing 1310.

As the plurality of light emitting device packages 10, the light emitting device package 10 having the structure described above according to the foregoing embodiment of the present disclosure with reference to FIG. 1 may be used. Thus, a detailed description thereof will be omitted.

The housing 1310 may serve to support the light emitting device packages 10. Further, the housing 1310 may be formed of a material such as a metal so as to allow light from the light emitting device packages to be discharged to the outside.

The optical sheet 1320 may include a prism sheet, a light diffusion sheet, or the like, to allow for uniform diffusion of light emitted by the plurality of light emitting devices packages 10.

Lighting devices using light emitting devices may be largely classified as indoor LED lighting devices and outdoor LED lighting devices according to the use thereof. The indoor LED lighting device may mainly be used in a bulb-type lamp, an LED-tube lamp, or a flat-type lighting device, as an existing lighting device retrofit, and the outdoor LED lighting device may be used in a streetlight, a safety lighting fixture, a light transmitting lamp, a landscape lamp, a traffic light, or the like.

In addition, a lighting device using LEDs may be utilized as internal and external light sources in vehicles. As the internal light source, the lighting device using LEDs may be used as interior lights for motor vehicles, reading lamps, various types of light source for an instrument panel, and the like, and as the external light sources used in vehicles, the lighting device using LEDs may be used in all types of light sources such as headlights, brake lights, turn signal lights, fog lights, running lights for vehicles, and the like.

Furthermore, as light sources used in robots or in various kinds of mechanical equipment, LED lighting devices may be applied. In detail, an LED lighting device using light within a special wavelength band may promote the growth of a plant, may stabilize people's moods, or may also be used therapeutically, as emotional lighting.

According to exemplary embodiments in the present disclosure, a light emitting device package capable of preventing the occurrence of problems caused by using a secondary lens according to the related art and a lighting device having the same may be provided.

While exemplary embodiments have been shown and described above, it will be apparent to those skilled in the art that modifications and variations could be made without departing from the scope of the present disclosure as defined by the appended claims.

What is claimed is:

1. A light emitting device package comprising:
a reflective unit having a first surface and a second surface opposite to the first surface and having a through hole formed in a central portion of the reflective unit to penetrate through the first and second surfaces;
a light emitting device disposed in the through hole to be in contact with the reflective unit; and
an optical device disposed on the first surface of the reflective unit to cover the light emitting device,
wherein the optical device has a third surface facing the first surface of the reflective unit and a fourth surface disposed above the third surface,
wherein an overlapping portion of the fourth surface of the optical device with respect to the light emitting device is positioned directly above the light emitting device with respect to a plan view and is configured to allow light generated by the light emitting device to be partially transmitted and be partially reflected to be emitted externally.

2. The light emitting device package of claim 1, wherein the optical device has a fifth surface connecting the third surface to the fourth surface, and the fourth surface allows a portion of light emitted by the light emitting device and incident through the third surface to be transmitted directly through an upper portion of the fourth surface and emitted externally while allowing a portion of the light to be reflected toward the fifth surface and externally emitted through the fifth surface.

3. The light emitting device package of claim 2, wherein the fourth surface has a structure recessed from an edge of the fourth surface connected to the fifth surface to a center of the fourth surface through which an optical axis passes.

4. The light emitting device package of claim 2, wherein, with respect to a vertical cross section, the fifth surface of the optical device and a lateral surface of the reflective unit are aligned with each other.

5. The light emitting device package of claim 1, further comprising a reflective layer covering the fourth surface,
wherein the reflective layer is configured to partially transmit light coming from the light emitting device.

6. The light emitting device package of claim 5, wherein the reflective layer has a structure of a metal layer or a stacking structure of a plurality of transparent layers having different refractive indices.

7. The light emitting device package of claim 6, wherein the plurality of transparent layers are stacked on one another to have a structure in which refractive indices of at least three layers of the plurality of transparent layers are gradually increased from a bottom layer facing the fourth surface to a top layer.

8. The light emitting device package of claim 1, further comprising a wavelength conversion layer covering the light emitting device, wherein the wavelength conversion layer is provided as a surface of the wavelength conversion layer to be coplanar with the first surface of the reflective unit.

9. The light emitting device package of claim 1, wherein lateral surfaces of the optical device and the reflective unit are symmetrical with respect to an optical axis, respectively.

10. The light emitting device package of claim 1, wherein the light emitting device comprises at least one pair of electrode pads disposed on a surface of the light emitting device exposed to the second surface of the reflective unit.

11. The light emitting device package of claim 1, wherein the optical device further comprises a recess portion provided in a surface of the optical device disposed on the first surface of the reflective unit, wherein the recess portion is disposed directly above the light emitting device.

12. The light emitting device package of claim 1, wherein the light emitting device has a width smaller than that of the optical device, and the optical device has a width the same as or smaller than that of the reflective unit.

13. The light emitting device package of claim 1, wherein a majority of a vertical cross section of the fourth surface from a center portion of the optical device to an edge portion of the optical device is linear.

14. The light emitting device package of claim 13, wherein the vertical cross section of the fourth surface is linear from the center portion to the edge portion of the optical device.

15. A lighting device comprising:
a housing having an electrical connection structure; and
at least one light emitting device package mounted in the housing,
wherein the at least one light emitting device package comprises:
a reflective unit having a first surface and a second surface opposite to the first surface and having a through hole formed in a central portion of the reflective unit to penetrate through the first and second surfaces;
a light emitting device disposed in the through hole to be in contact with the reflective unit; and
an optical device disposed on the first surface of the reflective unit to cover the light emitting device,
wherein the optical device has a third surface facing the first surface of the reflective unit and a fourth surface disposed above the third surface,
wherein an overlapping portion of the fourth surface of the optical device with respect to the light emitting device is positioned directly above the light emitting device with respect to a plan view and is configured to allow light generated by the light emitting device to be partially transmitted and be partially reflected to be emitted externally.

16. The lighting device of claim 15, further comprising a cover mounted on the housing to cover the at least one light emitting device package.

17. A light emitting device package comprising:
a reflective unit having a first surface and a second surface opposite to the first surface, and having a through hole formed in a central portion of the reflective unit and penetrating through the first and second surfaces;
a light emitting device disposed in the through hole to be in contact with the reflective unit; and
an optical device disposed on the first surface of the reflective unit to cover the through hole,
wherein the optical device has a third surface facing the first surface of the reflective unit and a fourth surface disposed above the third surface,
wherein an overlapping portion of the fourth surface of the optical device with respect to the light emitting device is positioned directly above the light emitting device with respect to a plan view and is configured to allow light generated by the light emitting device to be partially transmitted and be partially reflected to be emitted externally.

18. The light emitting device package of claim 17, wherein the fourth surface of the optical device partially transmits and partially reflects light generated by the light emitting device.

19. The light emitting device package of claim 17, further comprising a layer covering the optical device, configured to transmit light generated by the light emitting device, and having a structure of a metal layer or a stacking structure of a plurality of transparent layers having different refractive indices.

\* \* \* \* \*